United States Patent [19]

Zambrano

[11] Patent Number: 5,300,451

[45] Date of Patent: Apr. 5, 1994

[54] PROCESS FOR FORMING A BURIED DRAIN OR COLLECTOR REGION IN MONOLITHIC SEMICONDUCTOR DEVICES

[75] Inventor: Raffaele Zambrano, Catania CT, Italy

[73] Assignee: SGS Thomson Microelectronics, S.r.l., Agrate Brianza, Italy

[21] Appl. No.: 967,553

[22] Filed: Oct. 27, 1992

Related U.S. Application Data

[63] Continuation of Ser. No. 685,541, Apr. 15, 1991, abandoned.

[30] Foreign Application Priority Data

Apr. 20, 1990 [IT] Italy .................... 6609 A/90

[51] Int. Cl.[5] ................. H01L 21/70; H01L 27/00
[52] U.S. Cl. ................. 437/59; 437/6; 437/31; 437/75; 148/DIG. 126; 257/273
[58] Field of Search .......... 437/59, 75; 257/273; 148/DIG. 126

[56] References Cited

U.S. PATENT DOCUMENTS

| | | | |
|---|---|---|---|
| 4,503,603 | 3/1985 | Blossfeld | 437/59 |
| 4,914,051 | 4/1990 | Huie et al. | 148/DIG. 126 |
| 5,034,337 | 7/1991 | Mosher et al. | 437/75 |

*Primary Examiner*—Olik Chaudhuri
*Assistant Examiner*—Long Pham

[57] ABSTRACT

The invention relates to a process for forming a buried drain or collector region in monolithic semiconductor devices comprising an integrated control circuit and one or more power transistors with vertical current flow integrated in the same chip. The process allows optimization of the current-carrying capacity and the series drain resistance of the power stage and operating voltage by the implantation of a buried gate region in a first epitaxial layer after the formation of said epitaxial layer. These buried gate regions high dopant concentrations where the dopants have low diffusion coefficients. These low diffusive dopants permit more accurate and form defined buried gate regions than current formation techniques utilizing formation of buried gate regions implemented in the substrate where these gate regions contain highly diffusive dopants.

18 Claims, 6 Drawing Sheets (LOW VOLTAGE CONFIGURATION)

(HIGH VOLTAGE CONFIGURATION)

PROCESS FOR FORMING A BURIED DRAIN OR COLLECTOR REGION IN MONOLITHIC SEMICONDUCTOR DEVICES

This is a continuation of U.S. application Ser. No. 07/685,541, filed Apr. 15, 1991 now abandoned.

BACKGROUND OF THE INVENTION (1) Field of the Invention

The present invention relates to a process for forming a buried drain or collector region in monolithic semiconductor devices comprising an integrated control circuit and one or more MOS or bipolar power transistors with vertical current flow integrated in the same chip.

(2) Description of the Related Art

Association in the same chip of power transistors with vertical current flow and an integrated control circuit provides a very compact and efficient device which is advantageous as compared with separate components.

A recurring problem in providing such devices is minimization of the differences S between the distance 1 separating the drain or collector junction of the power transistor from the substrate and the distance d separating said substrate from the lower margin of the isolation region of the integrated control circuit (for reasons which are explained below).

To minimize said differences S there is usually provided a buried drain region (or a buried collector region for bipolar devices) by means of selective implanting of phosphorous (a highly diffusive dopant) on the substrate. During the epitaxial growth and the subsequent diffusions the phosphorous rises to the top of the chip faster than the antimony with which the substrate is doped.

This technique has considerable drawbacks. A first problem consists of the large tolerances which must be respected for the layout rules because of the high lateral diffusion of the buried collector region. Moreover very thick epitaxial growths are necessary because allowance must also be made for rising of the antimony to the surface; yields are thus penalized because of the quality of the epitaxial layer. In addition there arise considerable difficulties of alignment of the subsequent photomaskings because plotting topographies through the thick epitaxial layers is a source of problems.

Moreover, implantation of high quantities of phosphorous (even higher than $10^{15}$ atom/cm$^2$) then gives rise to a very high defect rate; among other things about half of the dopant introduced diffuses to the substrate and is thus unused.

Finally, because of the thermal cycles necessary for manufacturing the device, the transition between the epitaxial and diffused collector regions is not sharp, but displays a trend with a low dC/dX gradient of the concentration C of dopant along the depth X in the chip. This low dC/dX gradient has very unfavorable consequences for the series drain resistance (Ron) of a MOS power transistor (or the current-carrying capacity in the case of a bipolar power transistor).

SUMMARY OF THE INVENTION

The process in accordance with the invention aims at overcoming the above drawbacks.

A first innovative process embodiment comprises the following steps:

growing on a substrate having a first type of conductivity a first epitaxial layer having the same type of conductivity;

forming in said first epitaxial layer at least one region with high concentration of dopant of the same type of conductivity as the substrate and low diffusion coefficient and which joins with said substrate and is designed to constitute the buried drain or collector region of the power transistor.

In accordance with other versions the process in accordance with the invention is characterized in that it comprises the following steps:

growing on a substrate of a first type of conductivity a first epitaxial layer having conductivity of the same or opposite type;

forming in said first epitaxial layer at least one region with high concentration of a dopant of the same type of conductivity as the substrate and high diffusion coefficient and which joins with said substrate and is designed to constitute the buried drain or collector region of the power transistor.

BRIEF DESCRIPTION OF THE DRAWINGS

The characteristics of the invention will be clearer by the description below and the annexed drawings of examples of the prior art and of nonlimiting examples of embodiments of the invention wherein.

DETAILED DESCRIPTION

Figure 1:
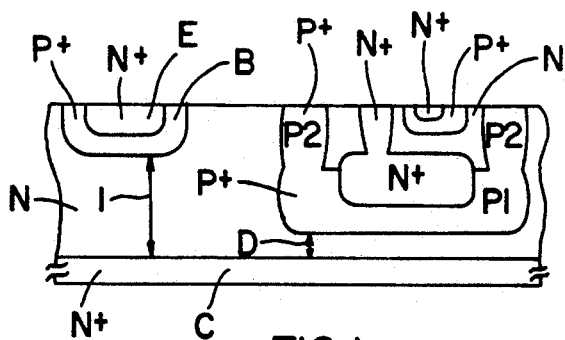
FIGS. 1 and 3 show examples of known structures with bipolar or MOS power transistors and integrated control circuit integrated monolithically in the same chip.

FIG. 1 shows a known example of a bipolar power transistor and integrated control circuit integrated monolithically in the same chip. For simplicity's sake only one component of the integrated control circuit (a low power npn transistor) and a single npn power transistor are shown.

The device is capable of operating correctly if the type p isolation region consisting of the whole of the P1 and P2 regions is connected to the lowest potential point of those in the device.

Figure 2:
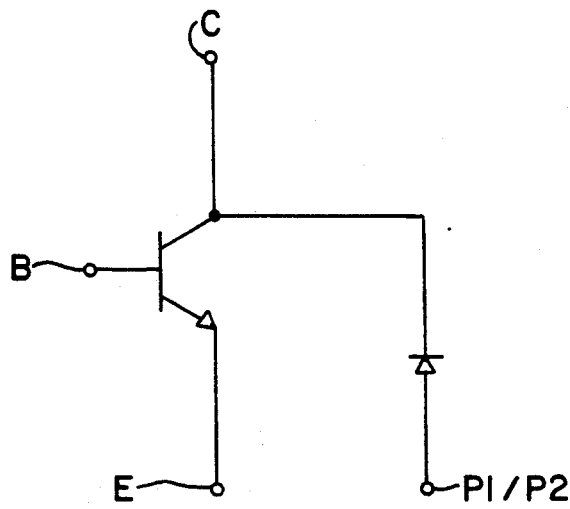
FIG. 2 shows the electrical equivalent of FIG. 1, FIGS. 4, 5, 6 and 7 show examples of known structures using a buried collector region or a buried drain region.

In FIG. 2, which represents the electrical equivalent of the structure, it is noted that the diode having as anode the isolation region and as cathode the collector region of the power transistor is therefore reverse biased, and hence the components of the integrated pilot circuit are isolated from the power stage. This circumstance makes possible the operation of the device.

However, in the structure of FIG. 1, it may be seen that the distance "D" separating the lower margin of the insulation region from the substrate is less than the distance "1" L separating the lower margin of the base region of the power transistor from the substrate. It follows that the breakdown voltage of the diode mentioned above is less than the breakdown voltage of the power transistor, and hence the maximum operating voltage of the device is determined by the former rather than the latter.

In designing a device it is thus obligatory to set the thickness D to withstand the maximum required voltage. The current-carrying capacity of a bipolar power stage, depends on the collector thickness and hence on L in accordance with an inverse quadratic proportionality law.

Since $L=(S+D)>D$, it is clear that said current-carrying capacity is penalized by the difference between the depth of the junction of the power transistor base and that of the horizontal isolation region P1.

Figure 3:
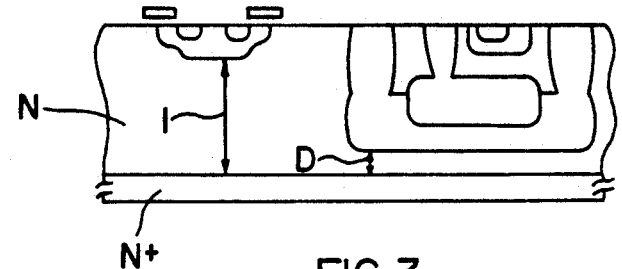
Figure 4:
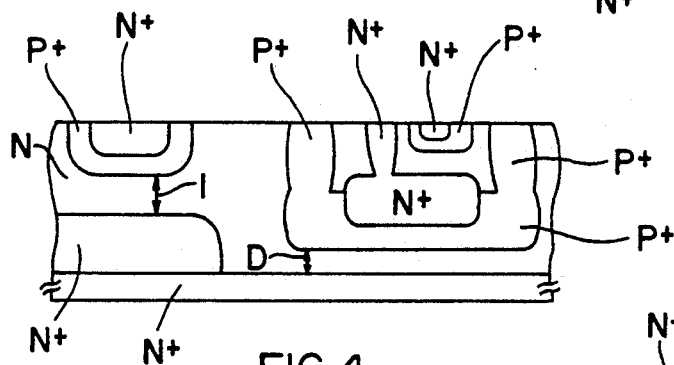
Figure 5:
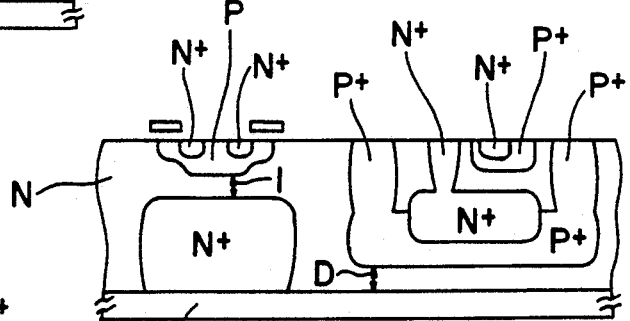
Figure 6:
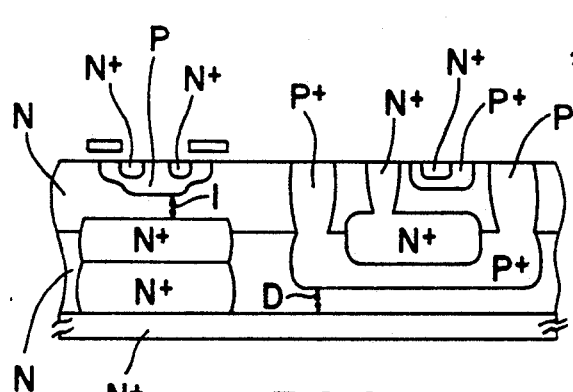
Figure 7:
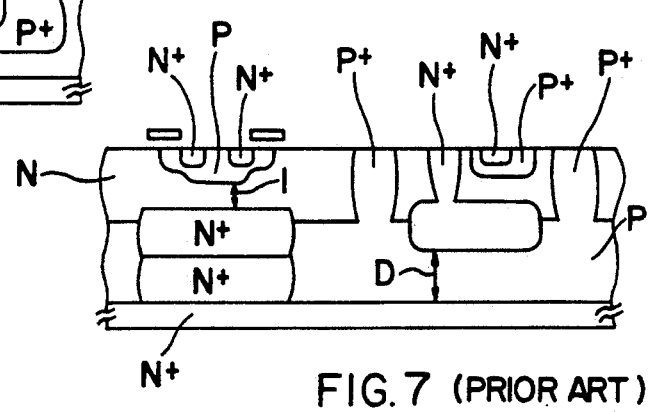

If the power stage is provided by MOS technology (as in FIG. 3), the most important parameter is the series drain resistance (Ron) which depends in a linear manner on 1.L. It is this magnitude which is penalized by the difference $S=L-D$.

FIGS. 4, 5, 6 and 7 show examples of structures which (in order to minimize the difference S) use a buried collector or buried drain region obtained by selective implantation of phosphorous on the substrate and then diffusion.

Figure 8:
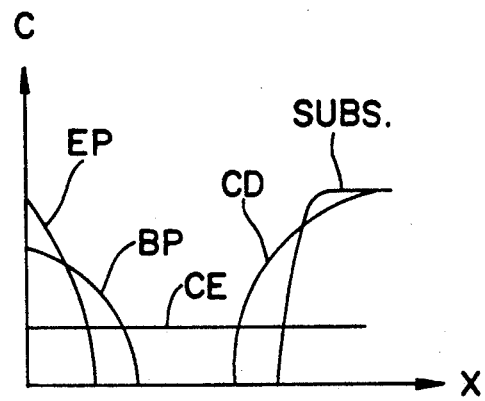
FIG. 8 shows the doping profiles in the bipolar power transistor zone of FIG. 4, FIGS. 9 and 10 show the doping profiles in the MOS power transistor zone of FIGS. 5 and 6.
Figure 9:
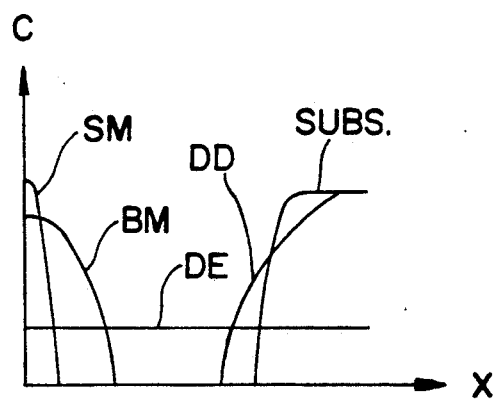

The concentration profile of the various kinds of dopants along the emitter, base and collector regions of the power transistor (with reference to FIG. 4) is illustrated in FIG. 8. The curves EP, BP, CE and CD refer to the dopant impurities used for the emitter, the base, the epitaxial region and the collector diffused region respectively. In FIG. 9 are shown the analogous curves for a high voltage MOS transistor (with reference to FIG. 5), i.e. SM for the source, BM for the channel region, DE and DD for the epitaxial region and the diffused drain region respectively.

Figure 10:
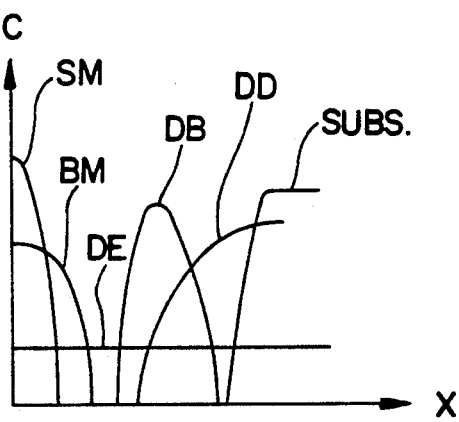

FIG. 10 finally summarizes the profiles for a low voltage MOS transistor (see MOS transistor of FIG. 6, remembering that analogous profiles apply also for the MOS transistor of FIG. 7); in comparison with FIG. 9, the buried layer region DB is also inserted for the power stage.

Figure 11:
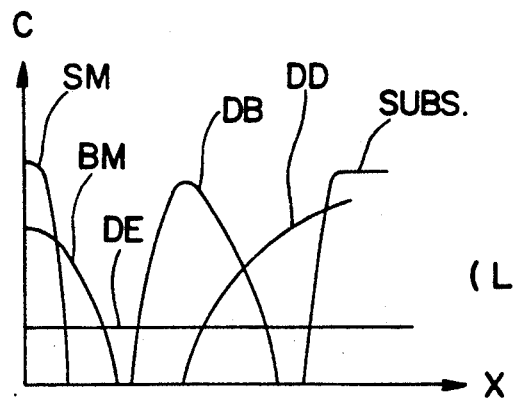
FIG. 11 shows the doping profiles in the power transistor zone, when the buried layer region is placed in series with the buried drain region.

For low voltage devices (FIGS. 6 and 7) introduction of buried layer region DB in series with the buried collector (drain) region DD can solve the problem because the region where the DD and DE curves cross is covered by the buried layer DB (see again FIG. 10). For high voltage devices this solution does not apply. To keep higher voltages it is necessary to increase the value of D and hence the superimposition of the regions DD and DB is no longer satisfactory, as seen in the example of FIG. 11. Note that minimum doping at the intersection of curves DB and DD is significantly lower in FIG. 11 than in FIG. 10. FIGS. 12 to 15 illustrate the steps of a first embodiment of the process in accordance with the invention.

Figure 12:
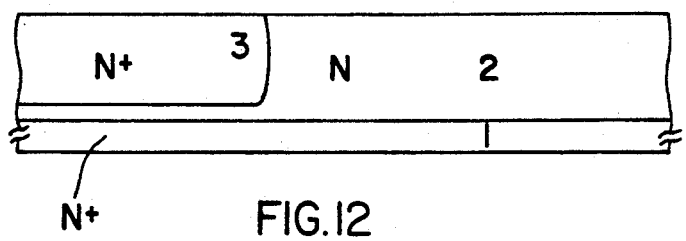
FIGS. 12, 13, 14 and 15 show a first sample embodiment of the process according to the invention.

On a monocrystalline silicon substrate 1 of n+ type having high impurities concentration there is grown a first epitaxial layer 2 of n type. Using known techniques of oxidation, photomasking, dopant implantation (arsenic or antimony) and diffusion as is disclosed in "VLSI Technology", edited by S. M. Sze, published by McGraw-Hill, chapters 4-6, there is provided a n+ type region 3 which constitutes the buried drain (FIG. 12).

At this point a new epitaxial growth is made by means of which there is obtained the n type layer 4 having uniform impurities concentration, which extends over the entire chip surface.

Figure 13:
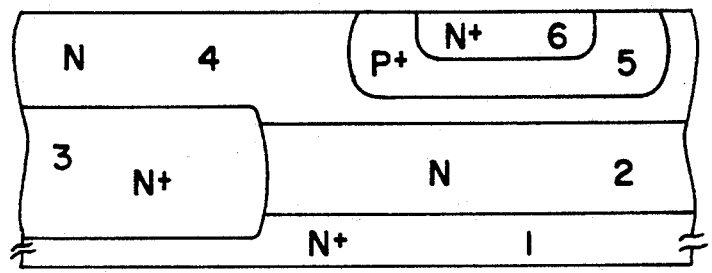

Again using the usual oxidation, photomasking, implantation and diffusion techniques as is disclosed in "VLSI Technology", edited by S. M. Sze, published by McGraw-Hill, chapters 4-6, there is provided in the layer 4 a p+ type region 5 which constitutes the horizontal isolation region of the integrated control circuit and, in the region 5, a type n+ region 6 (the so-called buried layer) designed to constitute the collector of the npn transistor of the control circuit (FIG. 13).

There is then provided a third epitaxial growth by means of which is obtained the type n layer 7 having uniform impurities concentration and extending over the entire chip surface.

Figure 14:
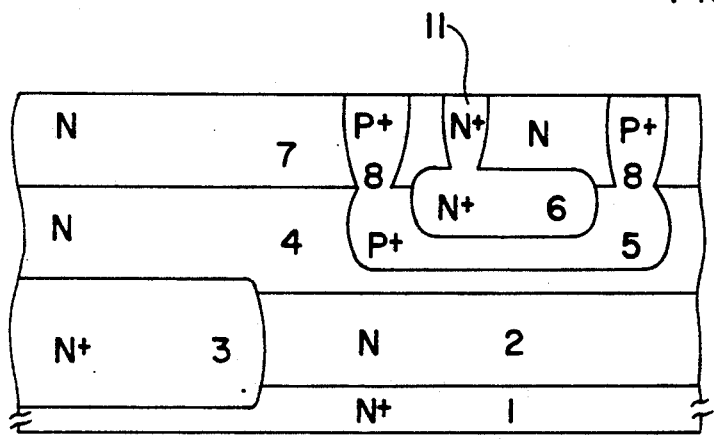

Again using known techniques of oxidation, photomasking, implantation and diffusion as is disclosed in "VLSI Technology", edited by S. M. Sze, published by McGraw-Hill, chapters 4-6, there is provided formation of the type p+ regions 8, which constitute the vertical isolation regions, and creation of the type n+ region 11 which serves as the sink of the low voltage npn transistor (necessary to reduce the collector series resistance), as illustrated in FIG. 14.

At this point there is provided by known as disclosed in "VLSI Technology", edited by S. M. Sze, published by McGraw-Hill, chapters 4-6, there is techniques the base region 12 and emitter region 13 of the low voltage npn transistor, there is deposited the polycrystalline silicon for the gate region 14, and there are defined the regions 9 (type p) and 10 (type n) which constitute the channel region and the source region respectively of the MOSFET power transistor.

Finally there are provided opening of the contacts and interconnection of the various element of the device by means of a metallization and photomasking process.

Figure 15:
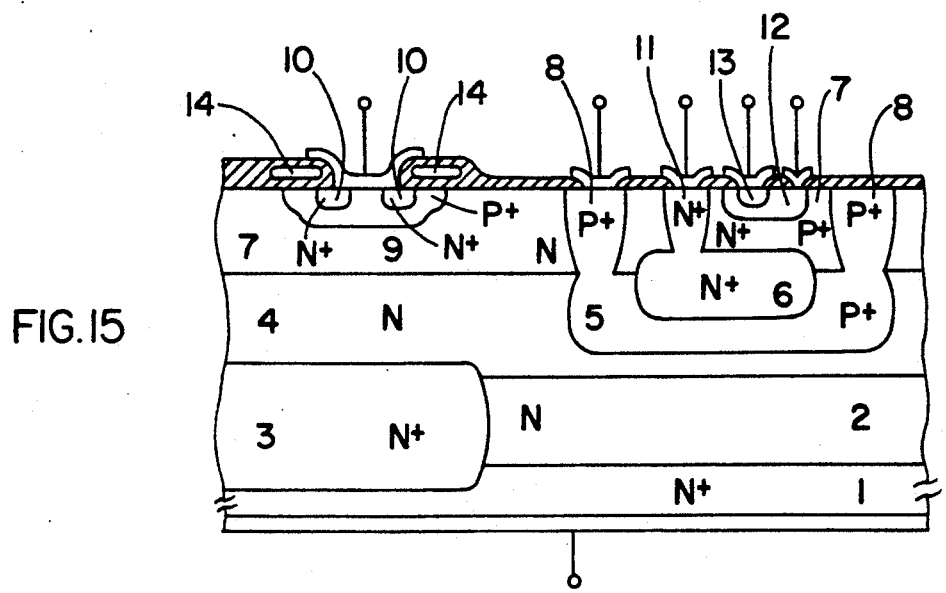

All the terminal electrodes of the various components are placed on the front of the chip except the drain of the power MOSFET which is located on the back thereof (FIG. 15).

Figure 16:
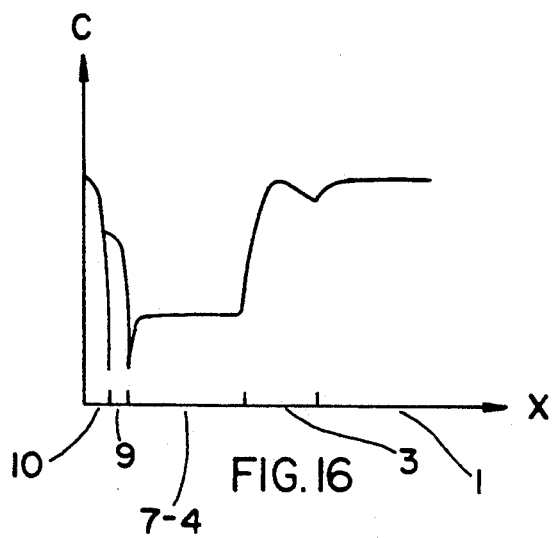
FIG. 16 shows the doping profiles in the power transistor zone of FIG. 15.

To analyze how the structure in accordance with the invention overcomes the problems of the known art reference is made to FIG. 16. Therein are shown the trends of dopant concentration along a cross section passing through the source 10, the channel region 9, the epitaxial drain 7 and 4, and the diffused drain 3 of the power transistor to the substrate 1.

The condition $L \leq D$ is respected merely by adjusting the thickness of the first epitaxial layer 2, which is determined by the difference between the junction depths of the power stage and of the horizontal isolation region of the integrated control circuit.

If a slow diffusing dopant, e.g. antimony, is used to provide the buried region 3, the interface between the epitaxial drain (in region 4) and the diffused drain (in region 3) is very well defined, certainly sharper than in the cases contemplated by the known art (on this point compare FIG. 16 with FIG. 9 and in particular gradient dC/d at the above mentioned interface). As already mentioned, this is advantageous.

In addition, use of a slow diffusing dopant allows reduction of the thickness of the epitaxial layer 4, simplifying in this manner the alignment procedure between the region 3 and the subsequent photomaskings.

It is clear that numerous variants and modifications can be made in the foregoing embodiment of the invention without thereby going beyond the scope thereof.

For example it is possible to insert inside the second epitaxial layer 4, in the region reserved for the power stage, a buried layer region 15 having high dopant concentration (similar to the buried layer region 6) if it is desired to provide a low voltage and low Ron device.

Figure 17:
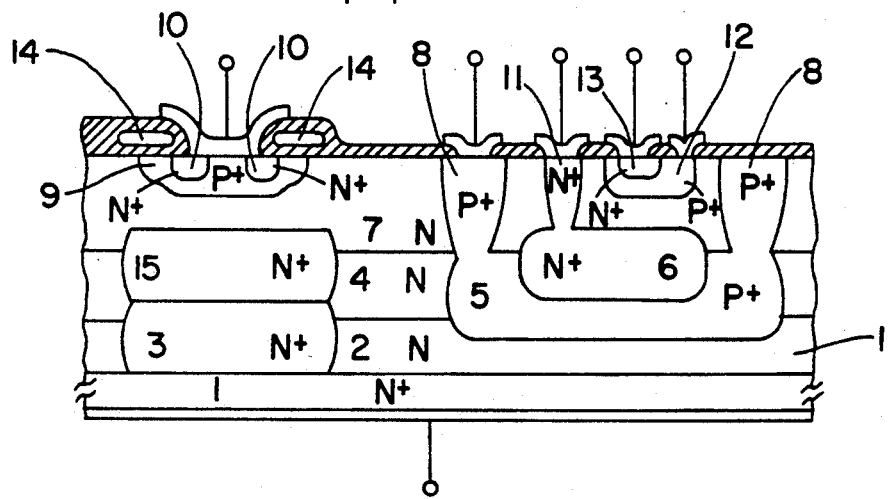
FIG. 17 shows a second sample embodiment of the process in accordance with the invention.

FIG. 17 illustrates the cross section of such a device. It is pointed out that in this case it is not necessary to consider a process sequence different from the one described above since it is sufficient to provide a different layout of the photomasking of the buried layer.

In a variant of the process in accordance with the invention the first epitaxial layer 2 or both the epitaxial layers 2 and 4 can be type p, provided that the region 3 is created subsequently to the first epitaxial growth and that the region 5 is created subsequently to the second epitaxial growth.

If both the epitaxial layers 2 and 4 are type p, creation of the diffused region 5 can be omitted because isolation of the control circuit is assured by the presence of the above mentioned type p epitaxial layers. The structures in accordance with the invention thus far described require three epitaxial growths.

There is now illustrated a new variant which, to provide the buried drain (collector) region as the former ones, dispenses with implantations of dopant directly on the substrate but is differentiated therefrom by the presence of only two epitaxial layers.

This process makes use of the growth of one epitaxial layer before implantation and diffusion of the diffused collector region, which in this case is provided by means of selective implantation of moderate quantities of a dopant having a high diffusion coefficient, e.g. phosphorous in quantities between $5 \cdot 10^{13}$ and $1 \cdot 10^{15}$ atom/cm$^2$.

It is described with reference to FIGS. 18 to 22.

A type n− epitaxial layer 22 is grown on a substrate of type n+ monocrystalline silicon 21 with high impurities concentration.

Figure 18:
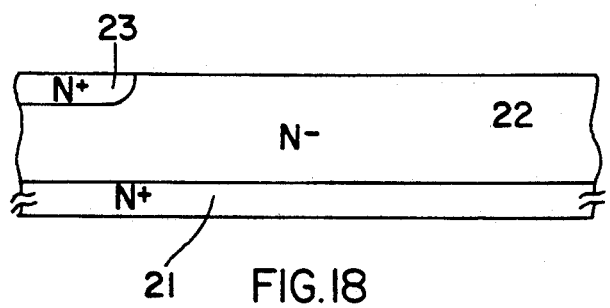
FIGS. 18, 19, 20, 21 and 22 show a third sample embodiment of the process according to the invention.

By known techniques of oxidation, photomasking, implantation and diffusion there is provided a type n+ region 23 which constitutes the buried drain (FIG. 18).

Figure 19:
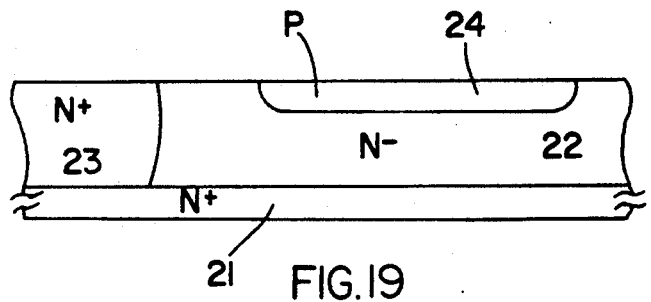

Again making use of the usual techniques of oxidation, photomasking, implantation and diffusion there is provided in the region 22 a type p region 24 which constitutes the horizontal isolation region of the integrated control circuit (FIG. 19).

Figure 20:
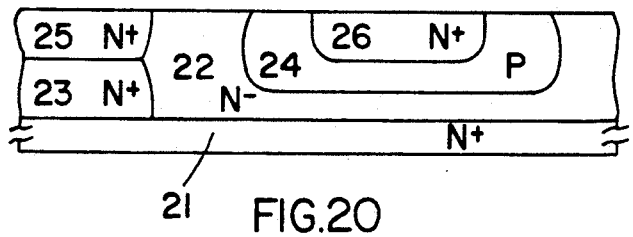

The next step is definition of the type n+ buried layer regions 25 and 26 in the regions 23 and 24 respectively, as can be seen in FIG. 20.

It is noted that the regions 24, 25, 26 are all provided in the first epitaxial layer 22, differently from the previous invention embodiments.

Figure 21:
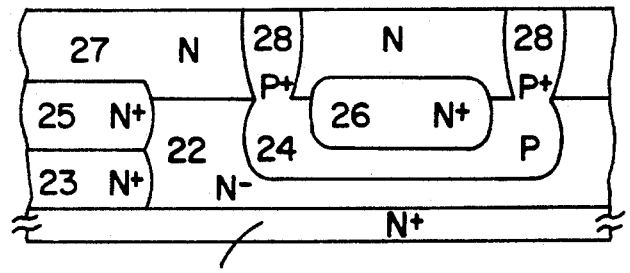

A second epitaxial growth is then made, by means of which the type n layer 27 is obtained which extends over the entire surface of the chip. Again using known techniques of oxidation, photomasking, implantation and diffusion there are formed type p+ regions 28 which constitute the vertical insulation regions necessary for insulating the integrated control circuit components from the power stage of the integrated circuit as illustrated in FIG. 21.

At this point the process continues (in accordance with the outline set forth above) with the provision of the base region 32 and emitter region 33 of the npn transistor of the control circuit, the polycrystalline silicon is deposited for the gate region 34 and there are provided the type p region 29 and the type n region 30 which constitute the channel and source regions respectively of the MOSFET power transistor.

Finally there is provided opening of the contacts and interconnection of the various elements of the device by means of a metallization and photomasking process.

Figure 22:
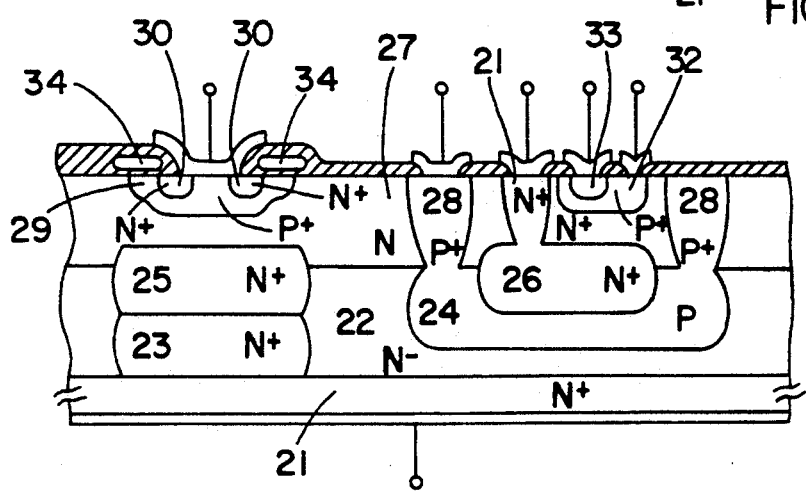

All the terminal electrodes of the various components are placed on the front of the chip except the drain of the power MOSFET which is located on the back thereof (FIG. 22).

Figure 23:
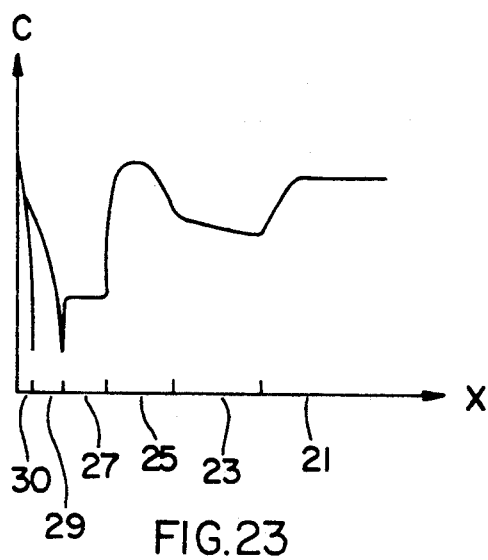
FIG. 23 shows the doping profiles in the power transistor zone of FIG. 22, FIGS. 24, 25, 26 and 27 show a fourth sample realization of the process in accordance with the invention.

FIG. 23 shows the doping profiles in the region reserved for the power stage along a cross section passing through the source (30), the channel region (29), the epitaxial drain (27), the buried layer (25), the buried drain (23) and the substrate (21).

The advantages of this structure in comparison with those of the known art are essentially that:

the quality of the first epitaxial layer, which is grown directly on the substrate and whose thickness can be reduced considerably, is significantly improved; and the quantity of phosphorous implanted is reduced by more than one order of magnitude and the dopant introduced is used entirely.

Figure 27:
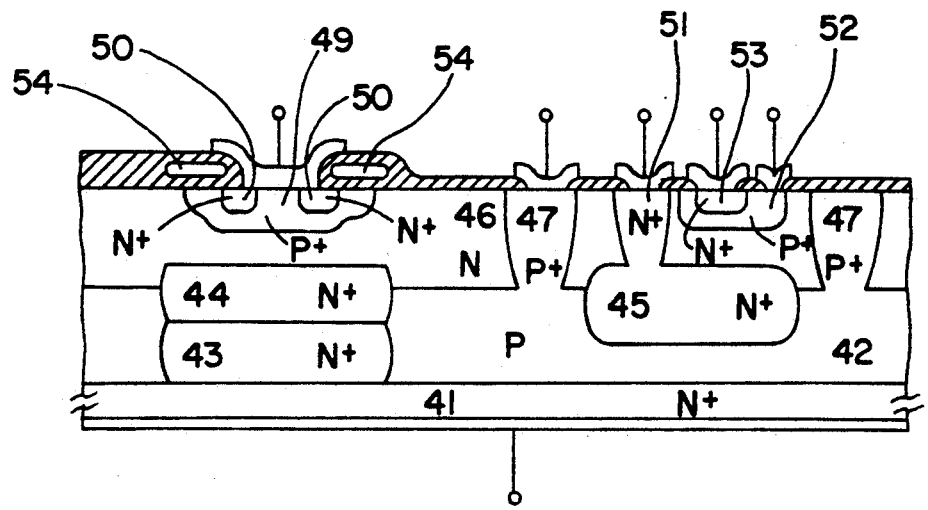

Another improvement in this structure consists of replacing the first type n epitaxial growth (region 22) with an analogous type p growth (region 42 of FIG. 27). In this case there can be eliminated the steps necessary for provision of the horizontal isolation region (region 24). The thickness of this type p epitaxial layer would be further reduced with positive effects on the Ron, too.

Figure 28:
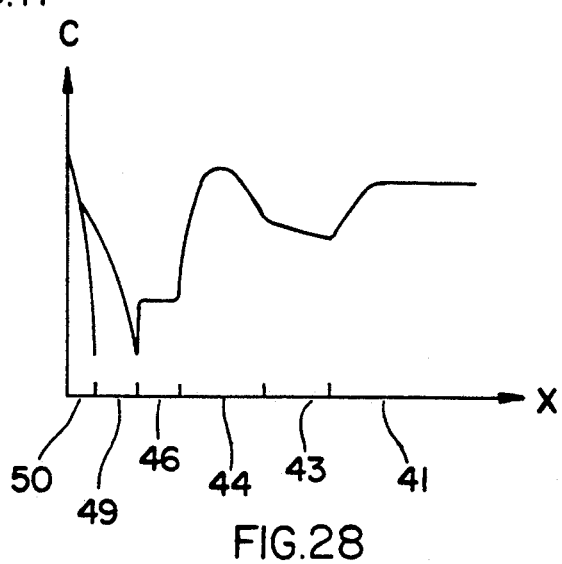
FIG. 28 shows the doping profiles in the power transistor zone of FIG. 27.
Figure 24:
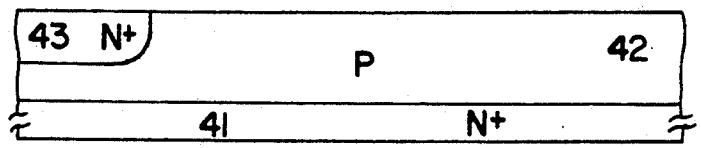
Figure 25:
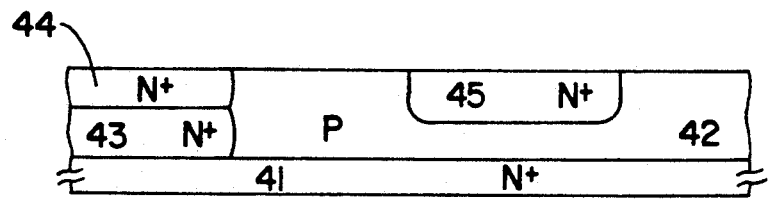
Figure 26:
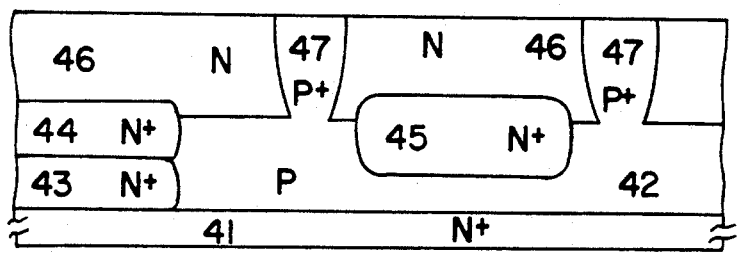

FIGS. 24, 25 and 26 visualize the process sequence for the production of the structure of FIG. 27, and FIG. 28 illustrates the doping profiles in the power MOSFET zone.

The examples of specific sample embodiments of FIGS. 15, 17, 22 and 27 refer to a power stage made up of a MOS transistor, but they also apply for the case of a power stage consisting of a bipolar transistor, it being sufficient to vary in a manner obvious to those skilled in the art the layout for the photomaskings of the final steps so as to provide the base and emitter regions of the bipolar power transistor in place of the channel and source regions of the MOS transistor.

I claim:

1. A process for forming a buried drain or collector region in monolithic, integrated, semiconductor devices containing an integrated control circuit and a power transistor with vertical current flow comprising the following steps:

growing a first epitaxial layer on a substrate having a first type of conductivity, introducing through the surface of said first epitaxial layer opposite of said substrate a high concentration of a dopant of a first type of conductivity having a low diffusion coefficient, whereby such introduction creates a first region which joins with said substrate to form a buried drain or collector region of said power transistor, growing a second epitaxial layer over said first epitaxial layer possessing a first type of conductivity, introducing through the surface of said second epitaxial layer opposite of said first epitaxial layer a concentration of dopant possessing a second type of conductivity whereby such introduction creates a second region which constitutes an isolation region of the integrated control circuit, introducing through the surface of said second epitaxial layer opposite of said first epitaxial layer a concentration of dopant of a first type of conductivity whereby such introduction creates at least one third region in said second epitaxial layer where at least one third region is located within said second region, growing a third epitaxial layer over said second epitaxial layer possessing a first type of conductivity, introducing through the surface of said third epitaxial layer opposite of said second epitaxial layer a concentration of dopant possessing a second type of conductivity whereby such introduction forms separated regions constituting at least one fifth region which is a portion of said power transistor and at least one sixth region which is connected to said second region constituting said isolation region; and, introducing through the surface of said third epitaxial layer opposite of said second epitaxial layer a concentration of dopant possessing a first type of conductivity whereby such introduction forms separated regions constituting at least one seventh region which is a portion of said power transistor located within said fifth region and an eighth region which is connected to said third region.

2. The process of claim 1, wherein said power transistors are field-effect power transistors.

3. The process of claim 1, wherein said high concentration of dopant with low diffusion coefficient includes Antimony.

4. The process in claim 1 wherein said low diffusion coefficient must be lower than that of Boron (B) or Phosphorous (P).

5. A process for forming a buried drain or collector region in monolithic, integrated, semiconductor devices containing an integrated control circuit and a power transistor with vertical current flow comprising the following steps:

growing a first epitaxial layer having a second type of conductivity on a substrate having a first type of conductivity, introducing through the surface of said first epitaxial layer opposite of said substrate a high concentration of a dopant of a first type of conductivity having a low diffusion coefficient, whereby such introduction creates a first region which joins with said substrate to form a buried drain or collector region of said power transistor, growing a second epitaxial layer having a second type of conductivity over said first epitaxial layer possessing a first type of conductivity, introducing through the surface of said second epitaxial layer opposite of said first epitaxial layer a concentration of dopant of a first type of conductivity whereby such introduction creates at least one third region in said second epitaxial layer where at least one third region is located within said second region, growing a third epitaxial layer over said second epitaxial layer possessing a first type of conductivity, introducing through the surface of said third epitaxial layer opposite of said second epitaxial layer a concentration of dopant possessing a second type of conductivity whereby such introduction forms separated regions constituting at least one fifth region which is a portion of said power transistor and at least one sixth region which is connected to said second region constituting said insulation region; and, introducing through the surface of said third epitaxial layer opposite of said second epitaxial layer a concentration of dopant possessing a first type of conductivity whereby such introduction forms separated regions constituting at least one seventh region which is a portion of said power transistor located within said fifth region and an eighth region which is connected to said third region.

6. The process of claim 5, wherein said power transistors are field-effect power transistors.

7. The process of claim 5, wherein said high concentration of dopant with low diffusion coefficient includes Antimony.

8. The process in claim 5 wherein said low diffusion coefficient must be lower than that of Boron (B) or Phosphorous (P).

9. A process for forming a buried drain or collector region in monolithic, integrated, semiconductor devices containing an integrated control circuit and a power transistor with vertical current flow comprising the following steps:

growing a first epitaxial layer having a second type of conductivity on a substrate having a first type of conductivity, introducing through the surface of said first epitaxial layer opposite of said substrate a high concentration of a dopant of a first type of conductivity having a high diffusion coefficient, whereby such introduction creates a first region which joins with said substrate to form a buried drain or collector region of said power transistor, introducing through the surface of said first epitaxial layer opposite of said substrate a concentration of dopant of a first type of conductivity whereby such introduction creates at least one second and one third region in said first epitaxial layer where one second region is located on top of said first region and separated from said third region, growing a second epitaxial layer over said first epitaxial layer possessing a first type of conductivity, introducing through the surface of said second epitaxial layer opposite of said first epitaxial layer a concentration of dopant possessing a second type of conductivity whereby such introduction forms separated regions constituting at least one fifth region which is a portion of said power transistor and at least on sixth region which is connected to said first epitaxial layer; and, introducing through the surface of said second epitaxial layer opposite of said first epitaxial layer a concentration of dopant possessing a first type of conductivity whereby such introduction forms separated regions constituting at least one seventh region which is a portion of said power transistor located within said fifth region and at least one eighth region which is connected to said third region.

10. The process of claim 9, wherein said power transistors are field-effect power transistors.

11. The process of claim 9, wherein said high concentration of dopant with high diffusion coefficient includes Boron (B).

12. The process in claim 9 wherein said high diffusion coefficient must be higher than that of Antimony (Sb) and Arsenic (As).

13. The process of claim 1, wherein said power transistors are bipolar junction power transistors.

14. The process of claim 1, wherein said high concentration of dopant with low diffusion coefficient includes Arsenic (As).

15. The process of claim 5, wherein said power transistors are bipolar junction power transistors.

16. The process of claim 5, wherein said high concentration of dopant with low diffusion coefficient includes Arsenic (As).

17. The process of claim 9, wherein said power transistors are bipolar junction power transistors.

18. The process of claim 9, wherein said high concentration of dopant with high diffusion coefficient includes Phosphorus (P).

* * * * *

UNITED STATES PATENT AND TRADEMARK OFFICE
CERTIFICATE OF CORRECTION

PATENT NO. : 5,300,451
DATED : April 5, 1994
INVENTOR(S) : Raffaele Zambrano

It is certified that error appears in the above-indentified patent and that said Letters Patent is hereby corrected as shown below:

Title page, item [73], Assignee: insert Consorzio per la Ricerca sulla Microelecttronica nel Mezzogiorno Catania CT, Italy.

Signed and Sealed this

Twentieth Day of September, 1994

Attest:

BRUCE LEHMAN

Attesting Officer

Commissioner of Patents and Trademarks